US006608472B1

United States Patent
Kutz et al.

(10) Patent No.: US 6,608,472 B1
(45) Date of Patent: Aug. 19, 2003

(54) BAND-GAP REFERENCE CIRCUIT FOR PROVIDING AN ACCURATE REFERENCE VOLTAGE COMPENSATED FOR PROCESS STATE, PROCESS VARIATIONS AND TEMPERATURE

(75) Inventors: Harold Kutz, Snoqualmie, WA (US); Monte Mar, Issaquah, WA (US); Warren Snyder, Snohomish, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 09/964,991

(22) Filed: Sep. 26, 2001

Related U.S. Application Data

(60) Provisional application No. 60/243,708, filed on Oct. 26, 2000.

(51) Int. Cl.$^7$ ................................................. G05F 3/16
(52) U.S. Cl. ........................................ 323/313; 323/316
(58) Field of Search ............................... 323/312, 313, 323/314, 316; 327/538, 540

(56) References Cited

U.S. PATENT DOCUMENTS

| | | | |
|---|---|---|---|
| 4,138,671 A | 2/1979 | Comer et al. ............... 340/347 |
| 5,202,687 A | 4/1993 | Distinti ...................... 341/158 |
| 5,430,395 A * | 7/1995 | Ichimaru ..................... 327/312 |
| 5,633,766 A | 5/1997 | Hase et al. ................... 360/51 |
| 5,939,949 A | 8/1999 | Olgaard et al. ............... 331/17 |
| 6,031,365 A * | 2/2000 | Sharpe-Geisler ............ 323/313 |
| 6,144,327 A | 11/2000 | Distinti et al. .............. 341/126 |
| 6,157,270 A | 12/2000 | Tso ............................ 331/176 |
| 6,191,660 B1 | 2/2001 | Mar et al. .................... 331/111 |
| 6,452,437 B1 * | 9/2002 | Takeuchi et al. ............ 327/513 |

OTHER PUBLICATIONS

CYPR–CD00229; "Novel Method and System for Interaction Between a Processor and a Power on Reset Circuit to Dynamically Control Power States in A Microcontroller"; Jun. 22, 2001; 09/887,923; Kutz et al.

* cited by examiner

Primary Examiner—Adolf Denske Berhane
(74) Attorney, Agent, or Firm—Wagner, Murabito & Hao LLP

(57) ABSTRACT

The present invention relates to a band-gap reference circuit. The circuit comprises a plurality of diodes connected in series in one or more chains, a current source to flow current through the diode chains, and a selection of shunt current sources. The shunt current sources are connected in parallel with the main current sources and each, or any, can be selected in order to add current to the diode chain. In this manner, current flow through the diode chain is adjusted in order to provide a trimmable band-gap reference voltage. By adjusting the current flow, the high precision reference voltage circuit can provide a very accurate reference value for variations in process state, process error and temperature.

23 Claims, 3 Drawing Sheets

BAND-GAP REFERENCE CIRCUIT FOR PROVIDING AN ACCURATE REFERENCE VOLTAGE COMPENSATED FOR PROCESS STATE, PROCESS VARIATIONS AND TEMPERATURE

RELATED U.S. APPLICATION

This Application claims priority to the copending provisional patent application Serial No. 60/243,708, entitled "ADVANCED PROGRAMMABLE MICROCONTROLLER DEVICE", with filing date Oct. 26, 2000, and assigned to the assignee of the present application.

FIELD OF THE INVENTION

The present invention relates to the field of microcontrollers and similar electronic devices.

BACKGROUND OF THE INVENTION

In the arena of complex integrated circuits, there are sometimes different portions of the circuit that require voltage references for proper functioning. A voltage reference provides a precise output voltage, one that is much more accurate than the power supply voltage, which can vary as much as +/−10%. Its output voltage is compared to other voltages in a system and, usually, adjustments are made to those other voltages based on the reference difference. References are similar to regulators in how they function, but they are used much differently. While regulators are used to deliver power to a load, references are normally used with a small, stable load (if any) to preserve their precision. Only a few of the existing reference designs have the capability to deliver a load greater than a few milliamps while maintaining a precision output voltage.

A reference is not used to supply power, but to provide a system with an accurate analog voltage for comparison purposes, even when the system experiences a large temperature change. The band-gap reference circuit has long been used in integrated circuits for that purpose.

Some early band-gap reference circuits used conventional junction-isolated bipolar-IC technology to make relatively stable low-voltage references. This type of reference became popular as a stable voltage reference for low-voltage circuits, such as in 5-volt data acquisition systems where zener diodes were not suitable. It is important to note that band-gap circuits also are now widely used in digital ICs to provide a local bias that is less adversely affected by ambient noises, transients or temperatures.

A band-gap reference takes advantage of the electrochemical properties of a material. In a semiconductor, the amount of energy which allows the material to become conductive, i.e. move current in the presence of a voltage, is known as the band gap energy. The band gap energy is different for a variety of materials. However, silicon, the foundation material for a preponderance of integrated circuits, has a predictable band-gap energy that changes little with temperature over most of the temperature range of normal integrated circuit operations.

The nominal temperature coefficient of a silicon diode is −2 mV/° C. However, the temperature coefficient is inversely proportional to the current density in the diode. By manipulating the current densities through two diodes and taking the difference in forward bias voltages, a circuit that provides a voltage with a well-defined positive temperature coefficient can be created. This voltage is then added to the forward bias voltage of a 3rd diode. The positive temperature coefficient of the voltage cancels the negative temperature coefficient of the 3rd diode and one is left with a circuit with a nearly zero temperature coefficient. In practice, the diodes are generally the base-emitter junctions of integrated circuit transistors.

Modern band-gap circuits provide a gain adjustment, made in process, to compensate for process errors. Trimming can also, currently, be accomplished post-process by laser trimming of the integrated circuit, an expensive addition to the manufacturing process. Such trimming might have to be done in high precision ICs to accommodate very minor variations in the absorption characteristic of the silicon encountered in manufacture., No band-gap circuit, however, currently offers trimmability that can be changed after an initial trim. Nor does any current band-gap circuit offer trimmability while in operation.

What is needed, then, is a band-gap reference circuit that can account and compensate for process state differences and process error differences without requiring laser trimming after manufacture. A further need exists for such accounting and compensation to be changed when conditions change. Furthermore, the band-gap reference circuit must be trimmable while in operation.

SUMMARY OF THE INVENTION

Presented herein is a band-gap reference circuit that accounts and compensates for process state differences and process error differences without requiring laser trimming post manufacture. The present invention further discloses such a band-gap reference circuit that allows accounting and compensation to be changed when conditions change. It also provides for digital trimmability while in operation.

The present invention relates to a band-gap reference circuit. The circuit comprises a plurality of diodes connected in series in one or more chains, a current source to flow current through the diode chains, and a selection of shunt current sources. The shunt current sources are connected in parallel with the main current sources and each, or any, can be selected in order to add current to the diode chain. In this manner, current flow through the diode chain is adjusted in order to provide a trimmable band-gap reference voltage. By adjusting the current flow, the high precision reference voltage circuit can provide a very accurate reference value for variations in process state, process error and temperature.

Embodiments of the present invention include a band-gap reference circuit in an electronic device which comprises a band-gap reference and a plurality of selectable shunt diodes wherein the shunt diodes can be selected for activation by logic.

BRIEF DESCRIPTION OF THE DRAWING

The operation and components of this invention can be best visualized by reference to the drawing.

DETAILED DESCRIPTION

Figure 1:
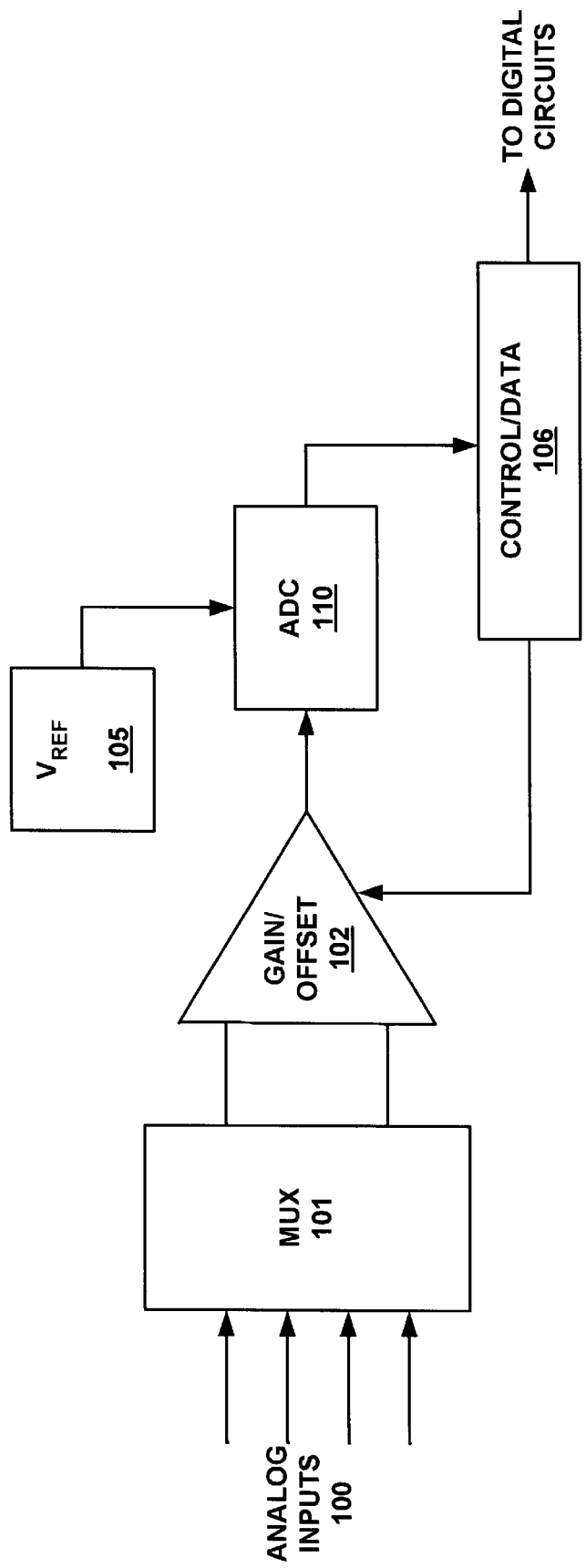
FIG. 1 illustrates a microcontroller in a typical installation consistent with embodiments of the present invention.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

The embodiments of the present invention discussed herein relate to the electronic characteristics of the semiconductor material from which integrated circuit devices are formed. Because of changes in the electronic properties of semiconducting materials, changes in temperature can affect behavior in any circuit. As a result, integrated circuits are typically designed with a reference circuit that is relatively stable over the temperature operating range the device can expect to see.

Modern integrated circuit devices are typically very small and work in very low voltages. In some cases, modern digital devices can draw a logic distinction between voltages differing by fractions of volts. Some analog or hybrid devices, such as ADCs (analog to digital converters) or DACs (digital to analog converters), however, can be required to make much smaller determinations.

ADCs are found by the millions in modern life. From phase tracking systems in utility power production to temperature sensing in a modern household refrigerator, ADCs are used in measuring virtually every measurable quantity. An ADC assesses an incoming voltage and produces a digital word that represents that voltage. A simple ADC, for example, working in 12 bit digital logic, must divide an incoming voltage into 4096 parts. Since a common input voltage range in data acquisition systems where ADCs are most commonly found is 0–5 volts, even a simple 12 bit ADC could be required to draw an accurate distinction between voltage differences as small as 0.001 volts. Differences in voltages, though, are much easier to accurately detect than absolute values. As conditions change in systems where ADCs are used, the same input voltage can be sensed differently by the same ADC because of temperature differences of the ADC itself or current fluctuations from the input source. Identical ADCs, too, can vary in the way they read inputs because of very subtle variations in the manufacturing process. As a result, many critical data acquisition systems are made very complex in order to attain near continual recalibration.

The embodiments of the present invention discussed herein will use the above example of an ADC for the sake of illustration. This discussion in no way limits the application of the concepts presented to ADCs or to any other particular device.

The embodiments of the present invention discussed here may be best understood with reference to the figures. FIG. 1 illustrates a block diagram of an ADC in a data acquisition system. Analog inputs 100 are, in this particular circuit, multiplexed by multiplexer 101 for further transmission to the data acquisition system. Gain/offset control 102 is commonly used to account for different sources and ranges. ADC 110 converts the analog information to digital, basing its voltage measurement on the input from $V_{REF}$ 105. Control feedback to the Gain/Offset controller is provided by controller 106 as the digital information is provided to the rest of the digital system.

Many modern data acquisition systems as outlined in FIG. 1 are now provided as systems-on-a-chip, with the functions illustrated in FIG. 1 all Implemented in the same chip. It is the function provided by $V_{REF}$ 105 that is of most interest in this discussion of this embodiment. For most implementations of such a system, a reference voltage is realized from the implementation of a Band-Gap circuit.

Band-gap circuits provide a very predictable voltage level and, taking a differential between the reference and a measured voltage, an ADC can make a reasonably reliable measurement. However, even well-designed band-gap circuits can sometimes be susceptible to variations in the output voltage caused by the smallest variations in the manufacturing process and by changes in temperature. Designers of band-gap circuits strive to attain, especially, a temperature-stable voltage. The relationship between temperature and change in voltage is the temperature coefficient.

Figure 2:
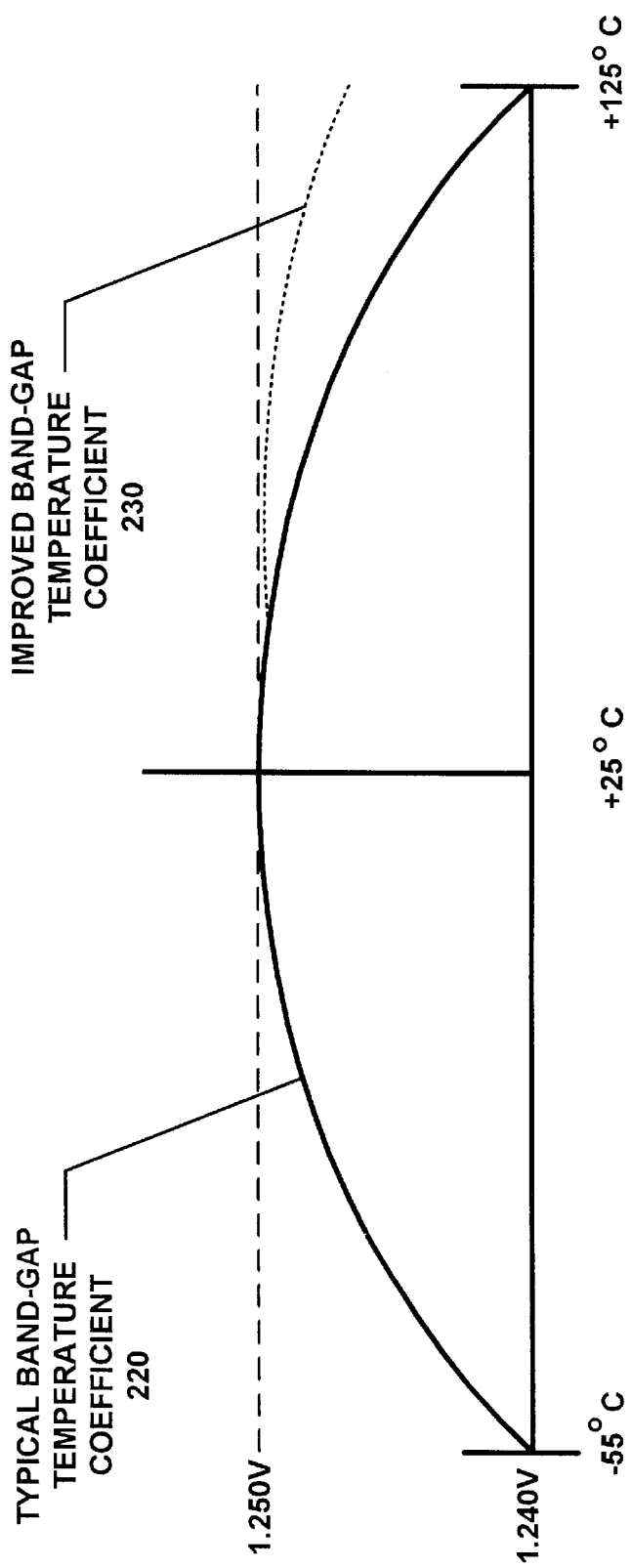
FIG. 2 illustrates a temperature coefficient curve consistent with the conventional art and with embodiments of the present invention.

FIG. 2 illustrates a typical temperature coefficient curve which represents the changes to a band-gap circuit voltage with variation in device temperature. Curves are generally designed to be relatively flat around 25° C. but begin to appreciably steepen at very cold and very hot temperatures. Since typical device operating temperatures are much hotter than 25° C., especially as devices run faster and therefore hotter, some means is necessary to flatten the curve at higher temperatures. Curve 220 illustrates a temperature coefficient curve for a typical band-gap reference. Curve 230 illustrates an improved temperature coefficient that might be obtained with implementations of embodiments of the present invention.

It has been shown that when a circuit has been trimmed to the correct voltage, the temperature coefficient curve will not vary significantly, despite process variation in parameters such as $V_{BE}$, beta, sheet resistivity, etc. Consequently, band-gap circuits are often designed with some trimmability which allows trimming them to their ideal voltage in order to provide as flat a temperature coefficient curve as possible. However, trimming currently is a one-time modification of a device by the use of lasers that cut connections in a devices. A laser trim can be relatively accurate but the device is limited to accurate performance at the trim point. Deviations from the trimmed-for conditions can result in non-optimal performance.

The ability to employ reliable devices in ever more hostile environments and have them perform accurately depends on more than one-time trimmability and a low temperature coefficient; it should ideally be a zero temperature coefficient. The embodiment of the present invention discussed herein provides a means of selectable trimming and temperature coefficient adjustment while the associated device is in electronic operation. Embodiments using such adjustment can achieve a nearly flat, zero deviation, temperature coefficient curve over a very large range of operating conditions.

Figure 3:
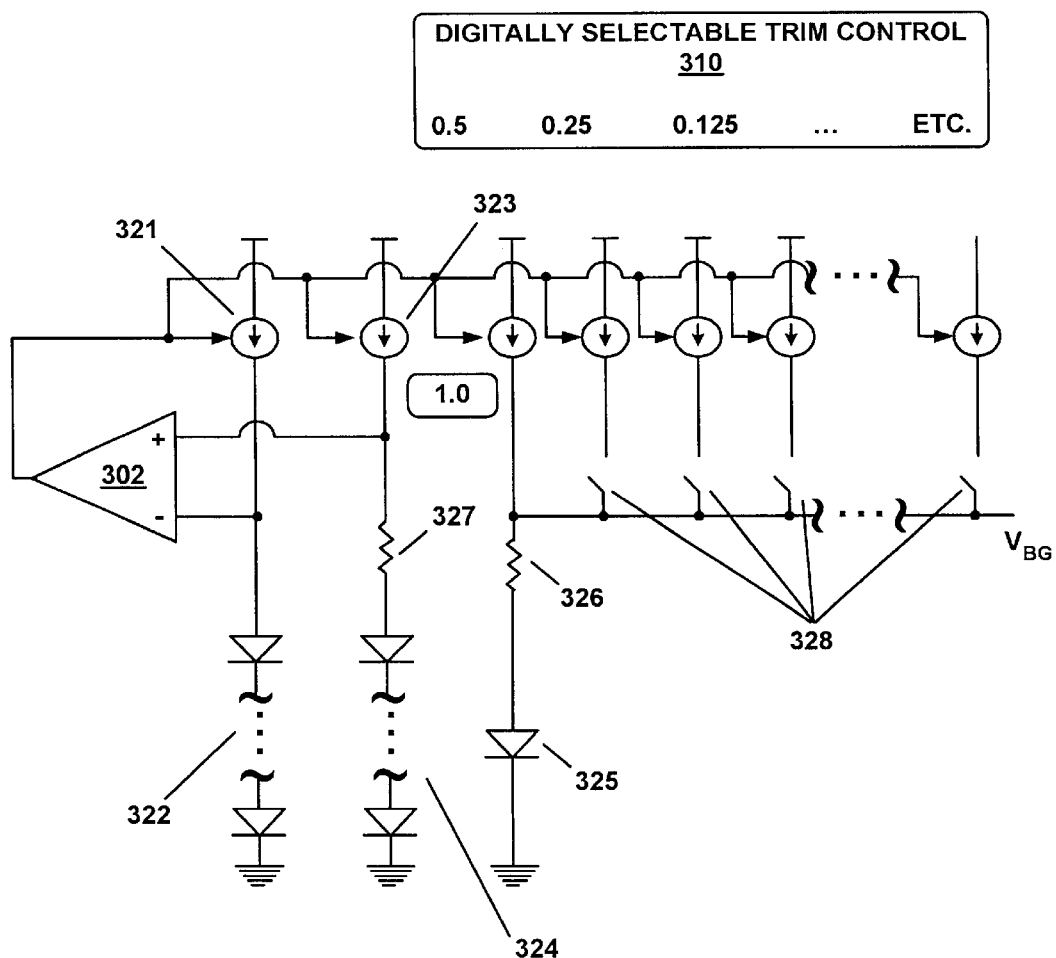
FIG. 3 illustrates a band-gap circuit with digitally selectable gain and K values, consistent with embodiments of the present invention.

FIG. 3 illustrates a band-gap circuit with digitally selectable gain values, consistent with embodiments of the present invention. The reference circuit illustrated in FIG. 3 consists of a differential amplifier 302, trimmable current sources 321 and 323, diode chains 322 and 324, and selectable shunts 310. The reference voltage is $V_{BG}$. The input voltage to amplifier 302 is determined by selection of varying strength shunts 310. A difference in current flows in diode chains 322 and 324 is caused by the existence of resistor 327 in series with diode chain 324.

In the embodiment illustrated in FIG. 3, trimmable current sources 321 and 323 are controlled by the output of differential amplifier 302. Selectable digital control in operation is achieved by turning on or off current shunts, 310. By selecting the amount of current added, the current available through diode 325 and resistor 326 is adjusted, thus varying band-gap reference voltage $V_{BG}$.

Turning on or off shunt current sources 310 could be accomplished in a number of ways. In this embodiment of the present invention it is envisioned that each of the shunt current sources would be commanded by a bit in a digital word held in some form of register. The register, and the routine that determines its content, could even be resident on the same integrated circuit device containing the adjustable band-gap reference circuit. As discussed earlier, diodes in this environment are usually implemented as transistors as easily as supplying a voltage to the base of a unijunction transistor or pulling down the gate of an FET. Such an implementation is implied by switches 328 in FIG. 3. Switches 328 would likely not be implemented as mechanical switches but quite likely be implemented as bipolar transistors. Other embodiments could employ different implementations.

The number of shunts available is not limited in this embodiment. As shown in FIG. 3, this embodiment is configured with current shunts that allow a selection of very finite adjustment. By way of example, with a combination of 1.0, 0.5, 0.25, 0.125, 0.0625, etc. $\mu$A shunts, the appropriate selection of shunt values could provide a very wide adjustment range yet very small adjustment steps. If there were eight shunts, each with half the shunt value of the next highest, the smallest value would provide an adjustment step value of 0.4% of the total shunt value available. Twelve shunts would allow for an adjustment step value of 0.024%. The important thing, though, is the ability to rapidly adjust, or trim, the current flow through diode chain 324 while the integrated circuit device is in operation.

A novel band-gap reference circuit has been disclosed. The foregoing descriptions of specific embodiments of the present invention have been presented for purposes of illustration and description. They are not intended to be exhaustive or to limit the invention to the precise forms disclosed, and obviously many modifications and variations are possible in light of the above description. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

We claim:

1. A band-gap reference circuit, comprising:
   a plurality of diodes electronically coupled in series in one or more chains;
   a current source electronically coupled with each of said diode chains; and
   a plurality of shunts electronically coupled to said diode series chains wherein said shunts are enabled to be electronically selected to divert current away from said series diode chains.

2. A band-gap reference circuit as described in claim 1, wherein said band-gap reference circuit resides in an integrated circuit device.

3. A band-gap reference circuit as described in claim 1, wherein said band-gap reference circuit further comprises a trimming amplifier electronically coupled so as to drive adjustment of the output voltage of said band-gap reference circuit.

4. A band-gap reference circuit as described in claim 1, wherein said shunts are implemented as diodes with resistors electronically coupled in series.

5. A band-gap reference circuit as described in claim 4, wherein said resistors associated with said shunt diodes are selected to provide adjustment to current shunted away from said diode series chains.

6. A band-gap reference circuit as described in claim 1, wherein said shunts are selected by logic.

7. A band-gap reference circuit as described in claim 1, wherein said shunts are selected for activation by logic in a mode register.

8. A band-gap reference circuit as described in claim 1, wherein the band-gap reference voltage is adjustable by selection of said shunts.

9. An electronic device, comprising:
   a band-gap reference circuit;
   electronic circuitry, requiring reference to said band-gap reference circuit and electronically coupled to said band-gap reference circuit; and,
   programmable circuitry, electronically coupled to said band-gap reference circuit; wherein said programmable circuitry is enabled to control the trimming current of said band-gap reference circuit.

10. An electronic device as described in claim 9, wherein said electronic device is an integrated circuit device.

11. An electronic device as described in claim 9, wherein said trimming current is controlled to adjust the reference voltage of said band-gap reference circuit.

12. An electronic device as described in claim 9, wherein said electronic device is an ADC.

13. An electronic device as described in claim 9, wherein said electronic device is a DAC.

14. An electronic device as described in claim 9, wherein said programmable circuitry comprises shunts selectable by logic.

15. An electronic device as described in claim 14, wherein said shunts are implemented as shunt diodes.

16. An electronic device as described in claim 14, wherein said shunts are selected by logic in a mode register.

17. An electronic device as described in claim 14, wherein said logic selects shunt diodes such that the temperature coefficient of said band-gap reference circuit is minimized.

18. In an integrated circuit device, a method for providing a reference voltage, comprising the steps of:

flowing current through a chain of diodes such that the band-gap voltage of said diodes adds up to said reference voltage;

providing selectable trimming shunts; and adjusting said flow of current through said chain of diodes by activating said trimming shunts such that desired amounts of current are shunted past said chain of diodes.

19. A method as described in claim 18, wherein said step of flowing current through a chain of diodes is accomplished by a trimmable current source.

20. A method as described in claim 18, wherein said step of providing selectable trimming shunts is accomplished by providing said shunts with diodes and resistors electronically coupled in series.

21. A method as described in claim 18, wherein said step of adjusting said flow of current is driven by a reference voltage.

22. A method as described in claim 18, wherein said step of adjusting said flow of current is controlled by logic.

23. A method as described in claim 22, wherein said controlling logic is resident in said integrated circuit device.

* * * * *